United States Patent [19]

Mochizuki et al.

[11] Patent Number: 5,374,863

[45] Date of Patent: Dec. 20, 1994

[54] SURFACE ACOUSTIC WAVE DEVICE, AND DEMODULATION DEVICE AND COMMUNICATION SYSTEM USING THE SAME

[75] Inventors: Norihiro Mochizuki, Machida; Hidetada Nago, Yokohama, both of Japan

[73] Assignee: Canon Kabushiki Kaisha, Tokyo, Japan

[21] Appl. No.: 83,432

[22] Filed: Jun. 29, 1993

[30] Foreign Application Priority Data

Jun. 29, 1992 [JP] Japan .................................. 4-192808
Jun. 29, 1993 [JP] Japan .................................. 5-182213

[51] Int. Cl.$^5$ ............................................ H01L 41/08
[52] U.S. Cl. .......................... 310/313 D; 310/313 B; 310/313 C; 364/821
[58] Field of Search ........... 310/313 B, 313 C, 313 D; 333/150–154, 193–196; 364/821

[56] References Cited

U.S. PATENT DOCUMENTS

| | | | |
|---|---|---|---|
| 3,845,419 | 10/1974 | Nudd | 310/313 B X |
| 3,882,433 | 5/1975 | Subramanian | 310/313 B X |
| 3,894,251 | 7/1974 | Shibayama et al. | 310/313 B |
| 4,075,582 | 2/1978 | Walker | 310/313 C X |
| 4,166,987 | 9/1979 | Coldren | 310/313 C X |
| 4,506,239 | 3/1985 | Cho et al. | 333/196 |
| 5,003,213 | 3/1991 | Mochuzuki et al. | 310/313 D |
| 5,136,266 | 8/1992 | Niitsuma | 310/313 B X |
| 5,164,628 | 11/1992 | Egara et al. | 310/313 D |
| 5,185,548 | 2/1993 | Egara et al. | 310/313 D |
| 5,200,663 | 4/1993 | Mochizuki et al. | 310/313 D |
| 5,256,927 | 10/1993 | Kato et al. | 310/313 B |

OTHER PUBLICATIONS

P. Freret, "Wireless Terminal Communications Using Spread-Spectrum Radio", Proc. Distributed Computing; Compcon 80, pp. 244–248 (Sep. 1980).

R. W. Cohn et al., "Sidelobe Compensation of Double Electrode SAW Transducers on Lithium Niobate", 1982 Ultrasonics Symposium Proc., pp. 18–22 (Oct. 1982).

Proceeding of the 1974 Institute of Electronics and Communication Engineers of Japan, S8-9, pp. 152–153 (and English translation).

1975 Joint Convention of Institute of Electrical Engineers, Japan 218, pp. 841–844 (and English translation).

*Primary Examiner*—Mark O. Budd
*Attorney, Agent, or Firm*—Fitzpatrick, Cella, Harper & Scinto

[57] ABSTRACT

A surface acoustic wave device includes a piezoelectric substrate, an input electrode formed on the substrate and an output electrode formed on the substrate. A surface acoustic wave is generated from the input electrode to propagate in a predetermined direction in accordance with an input signal. In the output electrode, a plurality of taps are arranged in a propagation direction of the surface acoustic wave on the substrate. The surface acoustic wave is converted into an electrical signal by the output electrode. The taps of the output electrode are weighted so that signals output from the taps have substantially equal magnitudes.

48 Claims, 4 Drawing Sheets

SURFACE ACOUSTIC WAVE DEVICE, AND DEMODULATION DEVICE AND COMMUNICATION SYSTEM USING THE SAME

BACKGROUND OF THE INVENTION

1. Field of the Invention

The present invention relates to a surface acoustic wave device and, more particularly, to a surface acoustic wave device used in demodulation of data in a spread spectrum communication, and a demodulation device and a communication system using this device.

2. Description of the Related Art

A surface acoustic wave is a wave which propagates while concentrating energy near the surface of a substrate, and allows easy input/output of a signal on the surface of the substrate. Thus, a surface acoustic wave device receives a lot of attention as a signal processing device.

FIG. 1 shows a conventional surface acoustic wave device. The principle of operation of the device will be described below with reference to FIG. 1. In FIG. 1, an input electrode 2 for exciting a surface acoustic wave and an output electrode 3 for converting the surface acoustic wave into an electrical signal are formed at predetermined positions on a piezoelectric substrate 1. The output electrode 3 is constituted by a plurality of taps $4_1, 4_2, 4_3, 4_4, 4_5, \ldots, 4_N$ arranged at equal intervals along a surface acoustic wave propagation path. Each of the taps $4_1$ to $4_N$ comprises a so-called interdigital transducer, and consists of one or a plurality of pairs of electrode fingers.

When a signal is input to the input electrode 2, the input signal is converted into a surface acoustic wave, and the surface acoustic wave propagates toward the output electrode 3. In the output electrode 3, since the surface acoustic wave reaches the taps $4_1$ to $4_N$ at predetermined time intervals, the output from the output electrode 3 becomes a synthesized output obtained by time-sampling the surface acoustic wave. The polarities of the taps $4_1$ to $4_N$ can be changed according to the arrangements of their electrode fingers. As a result, a total sum of values obtained by sampling the input signal at predetermined time intervals, and adding the polarities of the corresponding taps to the sampled valued is extracted as an output. Therefore, when the polarities of the taps are properly set, the taps operate as a correlator, and when the pattern of the input signal coincides with that defined by the taps $4_1$ to $4_N$ of the output electrode 3, the output becomes maximum.

Note that this surface acoustic wave device can similarly operate even when the input and output electrodes are replaced with each other. In this case, when the pattern of the input signal coincides with the tap pattern of the input electrode of the surface acoustic wave device, the output becomes maximum.

However, in the above-mentioned prior art, the taps comprise interdigital transducers having the same crossing width. Every time a surface acoustic wave passes a single tap, some components of surface acoustic wave energy are converted into an electrical signal or are reflected. For this reason, the surface acoustic wave energy propagating to the next tap is decreased. The magnitude of an electrical signal converted and extracted by each tap is decreased as the tap position is separated farther away from the input electrode. As a result, a signal obtained by synthesizing the outputs from the taps is offset from a correct correlation calculation, and signal quality deteriorates.

Since the device has only one code pattern, only a correlation signal corresponding to the code pattern on the device can be detected. For this reason, a plurality of correlation signals having different code patterns cannot be detected.

SUMMARY OF THE INVENTION

It is an object of the present invention to provide a surface acoustic wave device, a demodulation device, and a communication system, which can solve the conventional problems, and can obtain a correlation signal having high signal quality.

It is another object of the present invention to provide a surface acoustic wave device, a demodulation device, and a communication system, which can obtain correlation signals corresponding to a plurality of code patterns with a single device.

In order to achieve the above objects, a surface acoustic wave device according an aspect of the present invention comprises:
a piezoelectric substrate;
an input electrode, formed on the substrate, for generating a surface acoustic wave which propagates in a predetermined direction in accordance with an input signal; and
an output electrode, formed on the substrate, for converting the surface acoustic wave into an electrical signal,
wherein the input electrode comprises a plurality of taps aligned in a propagation direction of the surface acoustic wave, and the taps are weighted, so that surface acoustic waves generated from the taps have substantially equal magnitudes when they reach the output electrode.

In order to achieve the above objects, a surface acoustic wave device according to another aspect of the present invention comprises:
a piezoelectric substrate;
an input electrode, formed on the substrate, for generating a surface acoustic wave which propagates in a predetermined direction in accordance with an input signal; and
an output electrode, formed on the substrate, for converting the surface acoustic wave into an electrical signal,
wherein the output electrode comprises a plurality of taps aligned in a propagation direction of the surface acoustic wave, and the taps are weighted, so that signals output from the taps have substantially equal magnitudes.

In order to achieve the above objects, a surface acoustic wave device according to still another aspect of the present invention comprises:
a piezoelectric substrate;
an input electrode, formed on the substrate, for generating a surface acoustic wave which propagates in a predetermined direction in accordance with an input signal; and
an output electrode, formed on the substrate, for converting the surface acoustic wave into an electrical signal,
wherein the input electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the output electrode is smaller than a crossing width of the electrode fingers of the tap farther from the output electrode.

In order to achieve the above objects, a surface acoustic wave device according to still another aspect of the present invention comprises:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into an electrical signal, wherein the output electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the input electrode is smaller than a crossing width of the electrode fingers of the tap farther from the input electrode.

In order to achieve the above objects, a demodulation device according to an aspect of the present invention comprises:

a surface acoustic wave device for outputting a correlation signal on the basis of an input signal modulated according to data;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the input electrode comprises a plurality of taps aligned in a propagation direction of the surface acoustic wave, and the taps are weighted, so that surface acoustic waves generated from the taps have substantially equal magnitudes when they reach the output electrode.

In order to achieve the above objects, a demodulation device according to another aspect of the present invention comprises:

a surface acoustic wave device for outputting a correlation signal on the basis of an input signal modulated according to data;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the output electrode comprises a plurality of taps aligned in a propagation direction of the surface acoustic wave, and the taps are weighted, so that signals output from the taps have substantially equal magnitudes.

In order to achieve the above objects, a demodulation device according to still another aspect of the present invention comprises:

a surface acoustic wave device for outputting a correlation signal on the basis of an input signal modulated according to data;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the input electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the output electrode is smaller than a crossing width of the electrode fingers of the tap farther from the output electrode.

In order to achieve the above objects, a demodulation device according to still another aspect of the present invention comprises:

a surface acoustic wave device for outputting a correlation signal on the basis of an input signal modulated according to data;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the output electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the input electrode is smaller than a crossing width of the electrode fingers of the tap farther from the input electrode.

In order to achieve the above objects, a communication system according to an aspect of the present invention comprises:

a transmitter for transmitting a signal modulated according to data;

a receiver circuit for receiving the signal transmitted from the transmitter;

a surface acoustic wave device for outputting a correlation signal on the basis of the signal received by the receiver circuit;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the input electrode comprises a plurality of taps aligned in a propagation direction of the surface acoustic wave, and the taps are weighted, so that surface acoustic waves generated from the taps have substantially equal magnitudes when they reach the output electrode.

In order to achieve the above objects, a communication system according to another aspect of the present invention comprises:

a transmitter for transmitting a signal modulated according to data;

a receiver circuit for receiving the signal transmitted from the transmitter;

a surface acoustic wave device for outputting a correlation signal on the basis of the signal received by the receiver circuit;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the output electrode comprises a plurality of taps aligned in a propagation direction of the surface acoustic wave, and the taps are weighted, so that signals output from the taps have substantially equal magnitudes.

In order to achieve the above objects, a communication system according to still another aspect of the present invention comprises:

a transmitter for transmitting a signal modulated according to data;

a receiver circuit for receiving the signal transmitted from the transmitter;

a surface acoustic wave device for outputting a correlation signal on the basis of the signal received by the receiver circuit;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the input electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the output electrode is smaller than a crossing width of the electrode fingers of the tap farther from the output electrode.

In order to achieve the above objects, a communication system according to still another aspect of the present invention comprises:

a transmitter for transmitting a signal modulated according to data;

a receiver circuit for receiving the signal transmitted from the transmitter;

a surface acoustic wave device for outputting a correlation signal on the basis of the signal received by the receiver circuit;

a detection circuit for delay-detecting the correlation signal output from the surface acoustic wave device; and a data judging circuit for judging data on the basis of the output from the detection circuit, the surface acoustic wave device comprising:

a piezoelectric substrate;

an input electrode, formed on the substrate, for generating a surface acoustic wave which propagates in a predetermined direction in accordance with an input signal; and an output electrode, formed on the substrate, for converting the surface acoustic wave into the correlation signal, wherein the output electrode comprises an interdigital transducer having a plurality of taps aligned in a propagation direction of the surface acoustic wave, each of the taps comprises at least one pair of electrode fingers, and, of any two adjacent taps, a crossing width of the electrode fingers of the tap nearer the input electrode is smaller than a crossing width of the electrode fingers of the tap farther from the input electrode.

According to the present invention, weighting of the taps of the output electrode means that signals output from the taps have different magnitudes (energy levels) upon reception of a surface acoustic wave having a given magnitude (energy level). Therefore, when the weighting coefficients to be assigned to the taps are gradually increased as the tap position is apart from the input electrode, since a surface acoustic wave is gradually attenuated along with propagation, the magnitudes of signals output from the taps become substantially equal to each other.

According to the present invention, weighting of the taps of the input electrode means that the taps generate surface acoustic waves having different magnitudes when a signal having a given magnitude is input. Therefore, when the weighting coefficients to be assigned to the taps are gradually increased as the tap position is apart from the output electrode, a surface acoustic wave is gradually attenuated along with propagation. For this reason, when the surface acoustic waves generated from the taps reach the output electrodes, they have substantially same magnitude.

DETAILED DESCRIPTION OF THE PREFERRED EMBODIMENTS

Figure 1:
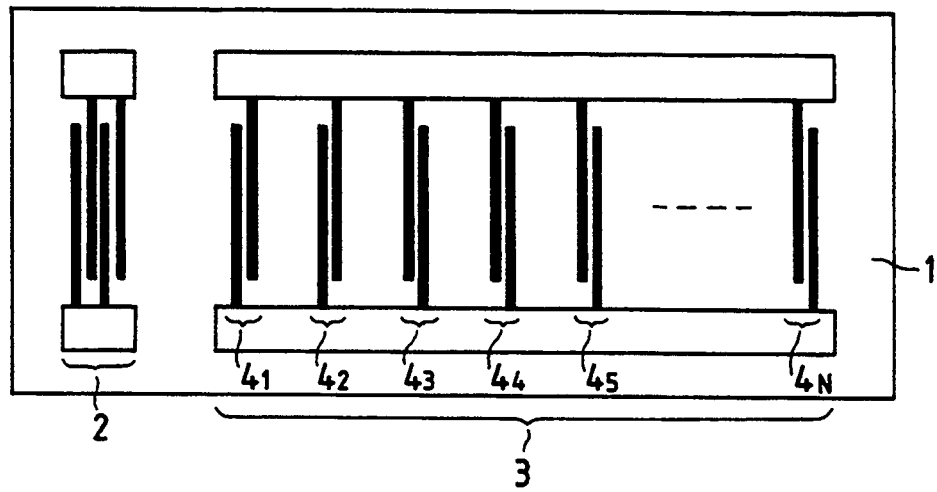
FIG. 1 is a schematic plan view showing a conventional surface acoustic wave device.
Figure 2:
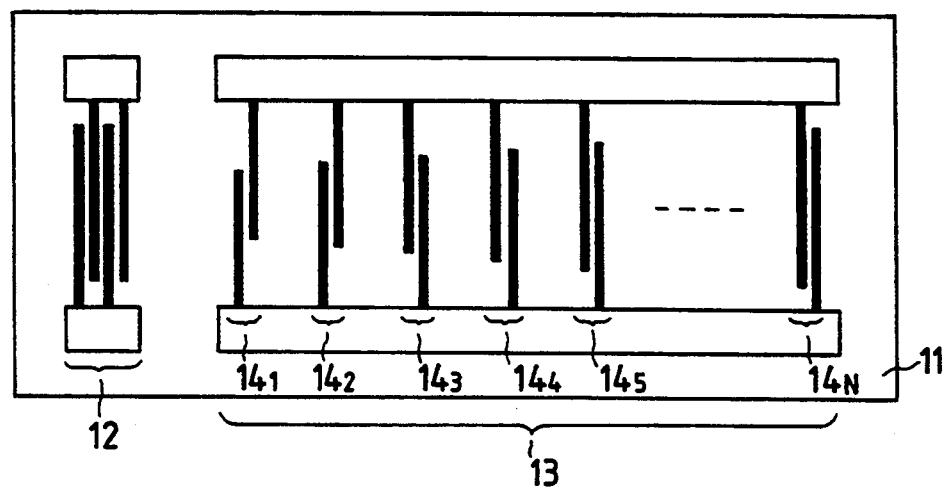
FIG. 2 is a schematic plan view showing a surface acoustic wave device according to the first embodiment of the present invention.

FIG. 2 is a schematic plan view showing a surface acoustic wave device according to the first embodiment of the present invention.

In FIG. 2, a piezoelectric substrate 11 consists of a piezoelectric material such as quartz, lithium niobate, or the like.

An input electrode 12 is formed at a predetermined position on the surface of the substrate 11. The input electrode 12 comprises an interdigital transducer (to be abbreviated as IDT hereinafter), and consists of a conductor such as aluminum, silver, gold, or the like.

An output electrode 13 is formed at a position opposing the input electrode 12 on the surface of the substrate 11. The output electrode 13 comprises an IDT, and consists of a conductor such as aluminum, silver, gold, or the like. The output electrode 13 is constituted by N taps $14_1$, $14_2$, $14_3$, $14_4$, $14_5$, ..., $14_N$ arranged at equal intervals along a surface acoustic wave propagation path. Each of the taps $14_1$ to $14_N$ comprises one or a plurality of pairs of electrode fingers.

This embodiment will be described in more detail below.

When a signal is input to the input electrode 12, a surface acoustic wave is excited, and propagates toward the output electrode 13. The surface acoustic wave reaches the tap $14_1$ of the output electrode 13 first. At the tap $14_1$, some components of the surface acoustic wave energy are converted into an electrical signal, and the electrical signal is extracted. Some other components of the surface acoustic wave energy are reflected by the tap, and the remaining energy reaches the next tap $14_2$. At the tap $14_2$, some components of the surface acoustic wave energy are converted into an electrical signal, and the electrical signal is extracted in the same manner as in the tap $14_1$. Also, some other components of the surface acoustic energy are reflected by the tap, and the remaining energy propagates toward the tap $14_3$. In this manner, some components of the surface acoustic wave energy are extracted by each tap, some other components are reflected by the tap, and the remaining energy propagates toward the next tap. Therefore, the surface acoustic wave energy reaching each tap is decreased as the tap position is apart from the input electrode 12.

Each tap comprises one or a plurality of pairs of electrode fingers, and only a surface acoustic wave which reaches the range of the crossing width of the electrode fingers is converted into an electrical signal. Thus, in this embodiment, the crossing widths of the electrode fingers are varied as weighting means for the taps, thereby equalizing the magnitudes of electrical signals output from the taps. More specifically, the crossing width of the i-th tap i is set to be larger than that of a tap i-1 closer to the input electrode 12 than the tap i in consideration of a decrease in surface acoustic wave energy in the tap i-1. Thus, electrical signals output from the taps have the same magnitude. When the electrical signals from the taps are synthesized and the synthesized output is extracted, a correct correlation output can be obtained.

Note that the electrode finger patterns of the taps $14_1$ and $14_2$, and the taps $14_3$, $14_4$, $14_5$, and $14_N$ are inverted to each other. Therefore, when a given signal is input, the signals output from these taps are opposite to each other, i.e., have a signal phase difference of 180°. The output electrode 13 is constituted by arranging such taps having different polarities in a predetermined pattern. The output electrode pattern corresponds to a code pattern of a key signal for judging an input signal. An input signal is modulated by switching between a signal having a pattern coinciding with that of the key signal and a signal having a phase inverted from that of the key signal in accordance with data. When the pattern of the input signal coincides with that of the output electrode, a maximum correlation output is obtained. When the input signal has a phase inverted from that of the key signal, there is obtained a correlation output whose amplitude is the same but phase is inverted. Therefore, the judgement "0" or "1" of data can be effected by comparing the phase of the correlation output with a reference signal or by comparing the phase of the correlation output with the correlation output of one or several bits before, thereby allowing demodulation of data.

In this embodiment, the same effect as described above can be obtained even when the input electrode 12 and the output electrode 13 are replaced with each other.

In this case, of a plurality of taps of an input electrode 13, as the tap position is apart away from an output electrode 12, the crossing width of the tap become larger, and a larger surface acoustic wave is excited. On the other hand, a surface acoustic wave excited from a tap nearer the output electrode 12 becomes smaller. For this reason, when the surface acoustic waves excited from the taps reach the output electrode 12, they have substantially the same magnitude.

In this embodiment, when the input and output electrodes comprise double electrodes (stripe electrodes), reflection of surface acoustic waves in the input and output electrodes can be suppressed.

A dummy electrode may be provided for the weighted electrode, so that the phase shift of surface acoustic waves due to the presence or absence of an electrode can be corrected.

Furthermore, the material of the piezoelectric substrate 11 is not limited to a piezoelectric single crystal such as quartz, lithium niobate, or the like. For example, a piezoelectric film may be added to a semiconductor or a glass substrate.

The weighting method of the taps of the IDT is not limited to a method by means of the crossing widths described in the above embodiment, i.e., a so-called apodize method. For example, an axial electric field weighting method, a capacity weighting method, a series weighting method, a voltage dividing method, and the like may be adopted. These methods are described in detail in:

Shibayama, Yamanouchi, & Sato, "Experimental Problems of Elastic Surface Wave Filter", 1975 Joint Convention of Institute of Electrical Engineers, Japan, pp. 841–844 (1975, 10)

Sato, et. al., "Elastic Surface Wave Filter based on Interdigital Electrodes Weighted With Exciting Strength", Proceeding of the 1974 Institute of Electronics and Communication Engineers of Japan, S8-9 (1974, 7).

Figure 3:
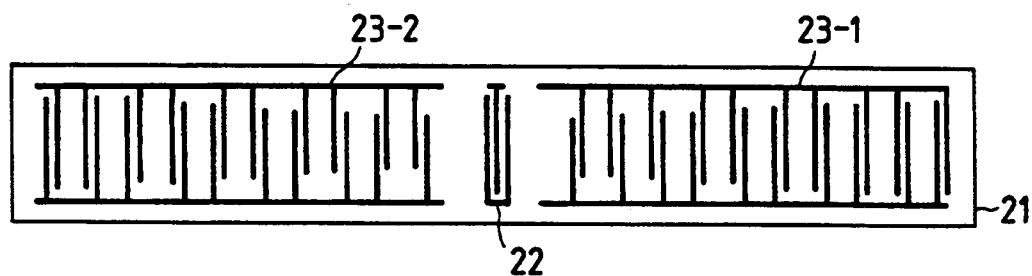
FIG. 3 is a schematic plan view showing a surface acoustic wave device according to the second embodiment of the present invention.

FIG. 3 is a schematic plan view showing the second embodiment of the present invention.

A surface acoustic wave generated by an input electrode propagates not only to a side where an output electrode is present but also to the two sides of the input electrodes. Thus, as shown in FIG. 3, output electrodes 23-1 and 23-2 are arranged at the two sides of an input electrode 22 on a piezoelectric substrate 21, and taps of these output electrodes are arranged to define different code patterns, thereby detecting correlation signals corresponding to two different code patterns.

The operation of this embodiment will be described below.

The two output electrodes 23-1 and 23-2 are arranged at the two sides of the input electrode 22, and the taps of the output electrodes are determined to obtain correlations with different code patterns, respectively. Codes at this time will be temporarily referred to as first and second code patterns. These first and second code patterns are preferably selected to have a small cross-correlation.

When a signal is input to the input electrode 22, a surface acoustic wave is generated, and propagates toward the two sides of the input electrode. If a signal having a correlation with the first code pattern is input, a large output signal is obtained from the output electrode 23-1. However, since the output electrode 23-2 and the input signal have a small correlation therebetween, almost no output signal is obtained from this electrode.

Similarly, if a signal which has a correlation with the second code pattern corresponding to the output electrode 23-2 is input, a large output signal is obtained from the output electrode 23-2. However, since the input signal has a small correlation with the first code pattern of the output electrode 23-1, almost no output signal is obtained from this electrode.

As described above, when the output electrodes corresponding to different code patterns are arranged at the two sides of the input electrodes, correlation outputs corresponding to the two different code patterns can be detected by a single device.

In this embodiment, when a signal obtained by synthesizing a first signal modulated by switching between a first code pattern signal and a signal the phase of which is inverted from that of the first code pattern signal in accordance with first data, and a second signal modulated by switching between a second code-pattern signal and a signal the phase of which is inverted from that of the second code pattern signal in accordance with second data is inputted as an input signal, a large correlation output signal to the first signal can be obtained from the output electrode 23-1 while a large correlation output signal to the second signal can be obtained from the output electrode 23-2. Therefore the signals of two kinds of code patterns are separated, so that demodulation can be effected.

Further, in this embodiment, when a signal modulated by switching between a first code pattern signal and a second code pattern signal in accordance with data is inputted as an input signal, a large correlation output can be obtained from either one of the output electrodes 23-1 and 23-2 in accordance with data. Therefore, a comparison is made on the amplitudes of the outputs from the output electrodes 23-1 and 23-2 to effect the judgement "0" or "1" of data, so that demodulation of data can be effected.

Figure 4:
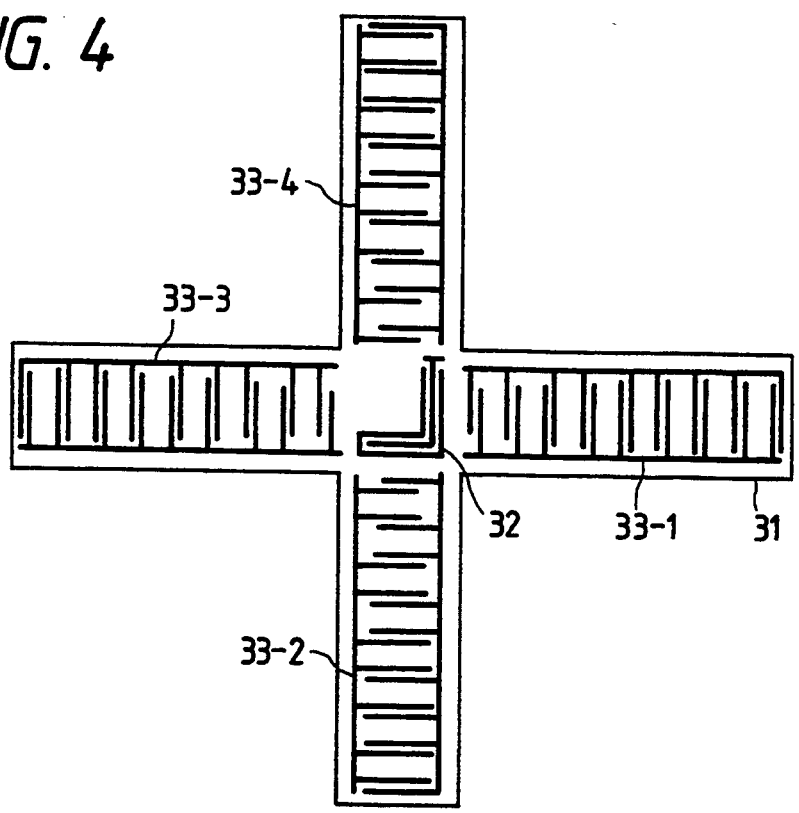
FIG. 4 is a schematic plan view showing a surface acoustic wave device according to the third embodiment of the present invention.

FIG. 4 is a schematic plan view showing the third embodiment of the present invention.

As shown in FIG. 4, when an L-shaped input electrode 32 is arranged on a piezoelectric substrate 31, four output electrodes 33-1, 33-2, 33-3, and 33-4 corresponding to four different code patterns can be arranged in a cross shape. As a result, correlation signals corresponding to four different code patterns can be detected by a single device.

Figure 5:
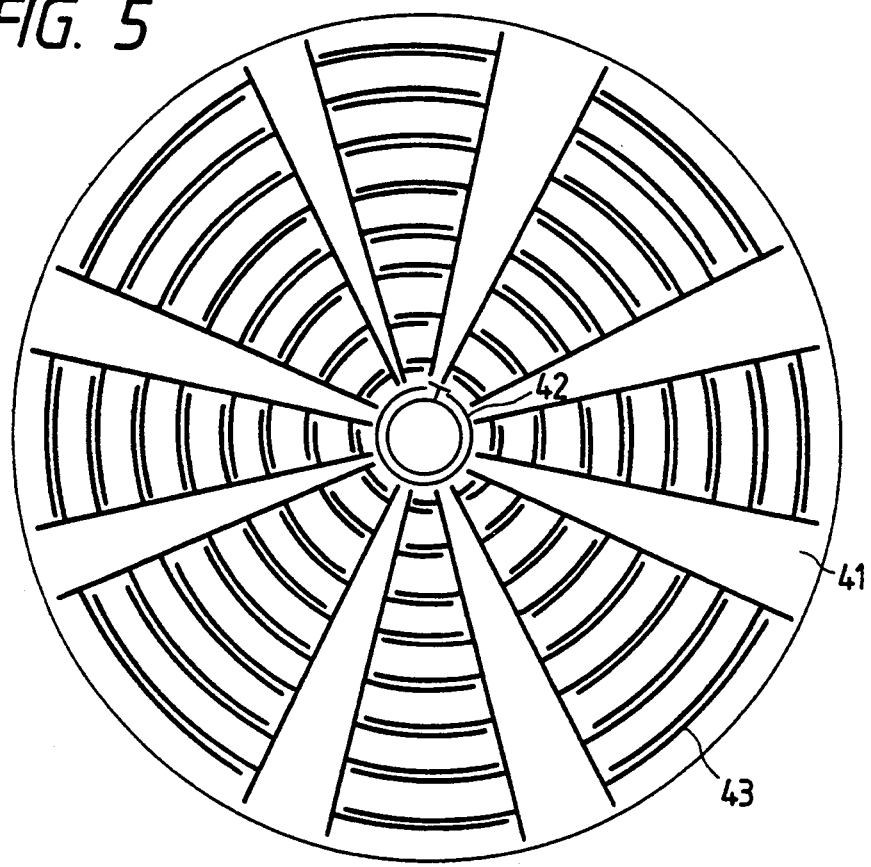
FIG. 5 is a schematic plan view showing a surface acoustic wave device according to the fourth embodiment of the present invention.

FIG. 5 is a schematic plan view showing the fourth embodiment of the present invention.

As shown in FIG. 5, an annular input electrode 42 is arranged at the center of a piezoelectric substrate 41, and a plurality of output electrodes 43 corresponding to specific code patterns are radially arranged around the input electrode 42, thereby obtaining correlation outputs corresponding to more different code patterns. FIG. 5 exemplifies a device having output electrodes 43 corresponding to eight different code patterns.

At this time, taps forming a code pattern of each output electrode 43 are arranged in an arc shape concentrical with the input electrode 42, so that the arcs have a constant central angle. Since the annular input electrode 42 is arranged at the central portion, a surface acoustic wave concentrically spreads like water rings.

In the surface acoustic wave devices of the second to fourth embodiments, the crossing widths of a plurality of taps forming each output electrode are changed as the weighting means described in detail in the first embodiment. The crossing width is increased as the tap position is apart from the input electrode, and electrical signals output from the taps have substantially the same magnitude, thereby improving signal quality.

Even when the above-mentioned weighting means is not arranged, according to the surface acoustic wave device of the present invention, correlation outputs corresponding to a plurality code patterns can be obtained by a single device.

Figure 6:
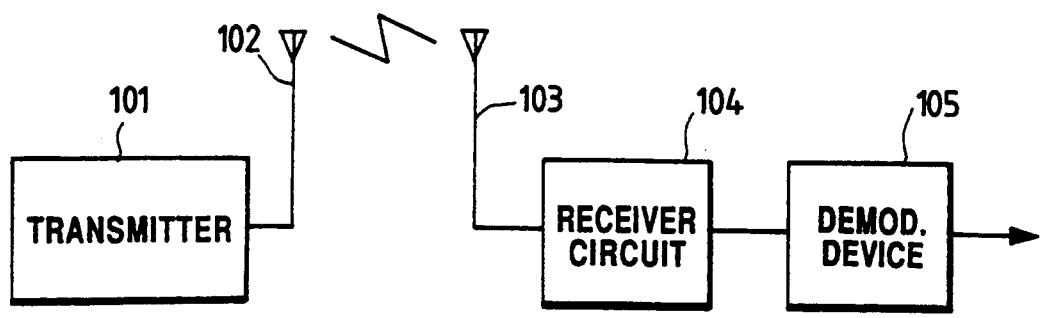
FIG. 6 is a block diagram showing a communication system using a surface acoustic wave device according to an embodiment of the present invention.

FIG. 6 is a block diagram showing a communication system according to an embodiment of the present invention using one of the surface acoustic wave devices shown in FIGS. 2 to 5. In FIG. 6, a transmitter 101 transmits a spread spectrum signal from an antenna 102. The transmitted signal is received by a receiver circuit 104 via an antenna 103, and the received signal is input to a demodulation device 105 including one of the surface acoustic wave devices shown in FIGS. 2 to 5, thereby demodulating data.

Figure 7:
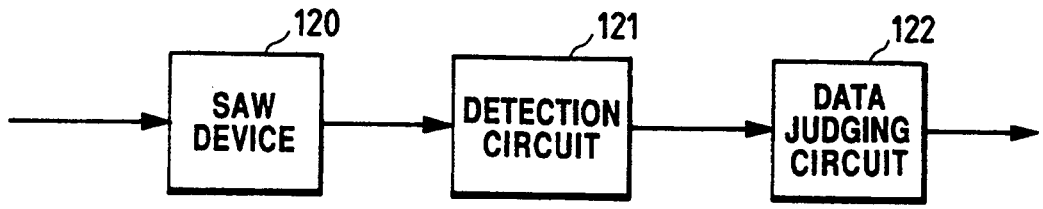
FIG. 7 is a block diagram showing a demodulation device using a surface acoustic wave device according to an embodiment of the present invention.

FIG. 7 is a block diagram showing an embodiment of the demodulation device.

The demodulation device shown in FIG. 7 includes a surface acoustic wave device 120 shown in one of FIGS. 2 to 5, a detection circuit 121 for delay-detecting an output from the surface acoustic wave device 120, and a data judging circuit 122 for judging data "1" or "0" in accordance with the output from the detection circuit 121. Although amplifiers, filters, and the like are not illustrated in FIG. 7 for the sake of simplicity, these circuit components are inserted before or after the above-mentioned circuits.

When the surface acoustic wave device shown in FIGS. 3, 4, or 5 is used as the SAW device 120 in this embodiment, the number of detection circuits 121 and data judging circuits 122 to be provided coincides with the number of the output electrodes of the SAW device to allow at once modulation of data the number of which corresponds to the number of the output electrodes of the SAW device.

Figure 8:
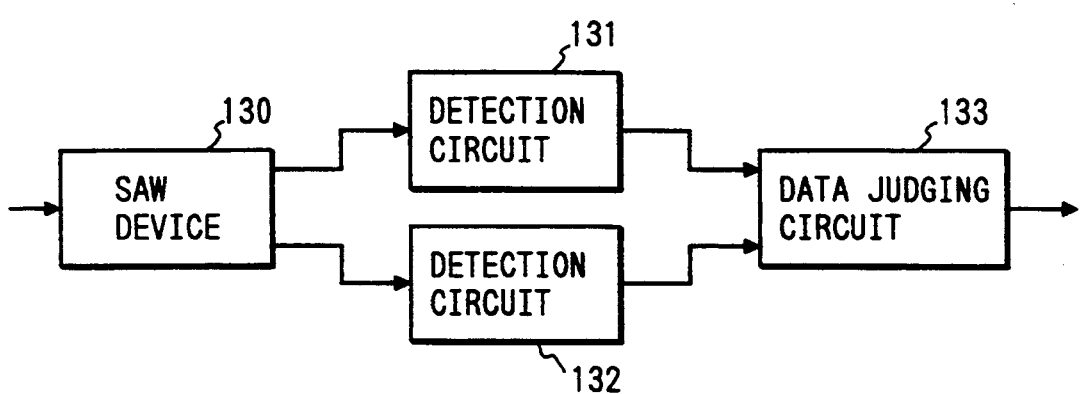
FIG. 8 is a block diagram showing a demodulation device using a surface acoustic wave device according to another embodiment of the present invention.

FIG. 8 is a block diagram showing a second embodiment of the modulation apparatus. In this embodiment shown in FIG. 8, the surface acoustic wave device shown in FIGS. 3, 4 or 5 is used as the SAW device 130, and reference numerals 131 and 132 denote detection circuits for delay-detecting an output from the SAW device 130. Reference numeral 133 denotes a data judging circuit for judging data "1" or "0" by comparing the outputs from the detection circuits 131 and 132.

When the surface acoustic wave device shown in FIG. 4 or 5 is employed as the SAW device 130 in this embodiment, plural bits data can be modulated at once by the manner that there are provided the detection circuits the number of which coincides with the number of the output electrodes of the SAW device and all outputs from the detection circuits are judged by a single data judging circuit or a plurality of data judging circuits.

The present invention permits various other applications in addition to the above-mentioned embodiments. The present invention includes all such applications within the scope of the claims.

What is claimed is:

1. A surface acoustic wave device for obtaining a correlation output from an input signal modulated according to data, said device comprising:
   a piezoelectric substrate;
   an input electrode, formed on said substrate, for generating a surface acoustic wave which propagates in a predetermined direction in accordance with an input signal; and
   an output electrode, formed on said substrate, for converting the surface acoustic wave into an electrical signal,
   wherein said input electrode comprises a plurality of taps for generating the surface acoustic wave, each having a polarity and arranged at equal spacing in the propagation direction of the surface acoustic wave so that the polarities constitute a predetermined pattern, and the respective taps are weighted such that surface acoustic waves generated from said respective taps have substantially equal magnitudes when they reach said output electrode.

2. A device according to claim 1, wherein said input electrode comprises an interdigital transducer, and each of said taps of said input electrode comprises at least one pair of electrode fingers.

3. A device according to claim 1, wherein said output electrode comprises an interdigital transducer.

4. A surface acoustic wave device for obtaining a correlation output from an input signal modulated according to data, said device comprising:
   a piezoelectric substrate;
   an input electrode, formed on said substrate, for generating a surface acoustic wave which propagates in a predetermined direction in accordance with an input signal; and
   an output electrode, formed on said substrate, for converting the surface acoustic wave into an electrical signal,
   wherein said input electrode comprises a plurality of taps for converting the surface acoustic wave into the electrical signal, each having a polarity and arranged at equal spacing in the propagation direction of the surface acoustic wave so that the polarities constitute a predetermined pattern, and the respective taps are weighted such that signals output from said respective taps have substantially equal magnitudes.

5. A device according to claim 4, wherein said output electrode comprises an interdigital transducer, and each of said taps of said output electrode comprises at least one pair of electrode fingers.

6. A device according to claim 4, wherein said input electrode comprises an interdigital transducer.

7. A device according to claim 4, further comprising at least another output electrode for converting the surface acoustic wave generated from said input electrode into an electrical signal, wherein said another output electrode comprises a plurality of taps the polarity pattern of which is different from that of said output electrode.

8. A device according to claim 7, wherein said another electrode and said other output electrode are arranged at two sides of said input electrode.

9. A device according to claim 7, wherein said output electrode and said another output electrode are radially arranged to have said input electrode as a center.

10. A surface acoustic wave device for obtaining a correlation output from an input signal modulated according to data, said device comprising:
    a piezoelectric substrate;
    an input electrode, formed on said substrate, for generating a surface acoustic wave which propagates in a predetermined direction in accordance with an input signal; and
    an output electrode, formed on said substrate, for converting the surface acoustic wave into an electrical signal,
    wherein said input electrode comprises an interdigital transducer in which a plurality of taps each having a polarity for generating the surface acoustic wave are arranged at equal spacing in the propagation direction of the surface acoustic wave so that the polarities constitute a predetermined pattern, and each of said taps comprises at least one pair of electrode fingers, and, of any two adjacent taps, a crossing width of said electrode fingers of a tap nearer said output electrode is smaller than a crossing width of said electrode fingers of a tap farther from said output electrode.

11. A device according to claim 10, wherein said output electrode comprises an interdigital transducer.

12. A surface acoustic wave device for obtaining a correlation output from an input signal modulated according to data, said device comprising:
- a piezoelectric substrate;
- an input electrode, formed on said substrate, for generating a surface acoustic wave which propagates in a predetermined direction in accordance with an input signal; and
- an output electrode, formed on said substrate, for converting the surface acoustic wave into an electrical signal,
- wherein said output electrode comprises an interdigital transducer in which a plurality of taps each having a polarity for converting the surface acoustic wave into the electrical signal are arranged at equal spacing in the propagation direction of the surface acoustic wave so that the polarities constitute a predetermined pattern, and each of said taps comprises at least one pair of electrode fingers, and, of any two adjacent taps, a crossing width of said electrode fingers of a tap nearer said input electrode is smaller than a crossing width of said electrode fingers of a tap farther from said input electrode.

13. A device according to claim 12, wherein said input electrode comprises an interdigital transducer.

14. A device according to claim 12, further comprising at least another output electrode for converting the surface acoustic wave generated from said input electrode into an electrical signal, wherein said another output electrode comprises a plurality of taps, the polarity pattern of which is different from that of said output electrode.

15. A device according to claim 14, wherein said output electrode and said another output electrode are arranged at two sides of said input electrode.

16. A device according to claim 14, wherein said output electrode and said another output electrode are radially arranged to have said input electrode as a center.

17. A demodulation device comprising:
- a surface acoustic wave device for outputting a correlation signal on the basis of an input signal modulated according to data;
- a detection circuit for envelope-detecting the correlation signal output from said surface acoustic wave device; and
- a data judging circuit for judging data on the basis of the output from said detection circuit,
- said surface acoustic wave device comprising:
  - a piezoelectric substrate;
  - an input electrode, formed on said substrate, for generating a surface acoustic wave which propagates in a predetermined direction in accordance with an input signal; and
  - an output electrode, formed on said substrate, for converting the surface acoustic wave into a correlation signal,
  - wherein said input electrode comprises a plurality of taps aligned in a propagation direction of the surface acoustic wave, and said taps are weighted, so that surface acoustic waves generated from said taps have substantially equal magnitudes when they reach said output electrode.

18. A device according to claim 17, wherein said input electrode comprises an interdigital transducer, and each of said taps of said input electrode comprises at least one pair of electrode fingers.

19. A device according to claim 17, wherein said output electrode comprises an interdigital transducer.

20. A device according to claim 17, wherein the input signal is a spread spectrum signal.

21. A demodulation device comprising:
- a surface acoustic wave device for outputting a correlation signal on the basis of an input signal modulated according to data;
- a detection circuit for delay-detecting the correlation signal output from said surface acoustic wave device; and
- a data judging circuit for judging data on the basis of the output from said detection circuit,
- said surface acoustic wave device comprising:
  - a piezoelectric substrate;
  - an input electrode, formed on said substrate, for generating a surface acoustic wave which propagates in a predetermined direction in accordance with an input signal; and
  - an output electrode, formed on said substrate, for converting the surface acoustic wave into the correlation signal,
  - wherein said output electrode comprises a plurality of taps aligned in a propagation direction of the surface acoustic wave, and said taps are weighted, so that signals output from said taps have substantially equal magnitudes.

22. A device according to claim 21, wherein said output electrode comprises an interdigital transducer, and each of said taps of said output electrode comprises at least one pair of electrode fingers.

23. A device according to claim 21, wherein said input electrode comprises an interdigital transducer.

24. A device according to claim 21, wherein the input signal is a spread spectrum signal.

25. A demodulation device comprising:
- a surface acoustic wave device for outputting a correlation signal on the basis of an input signal modulated according to data;
- a detection circuit for delay-detecting the correlation signal output from said surface acoustic wave device; and
- a data judging circuit for judging data on the basis of the output from said detection circuit,
- said surface acoustic wave device comprising:
  - a piezoelectric substrate;
  - an input electrode, formed on said substrate, for generating a surface acoustic wave which propagates in a predetermined direction in accordance with an input signal; and
  - an output electrode, formed on said substrate, for converting the surface acoustic wave into the correlation signal,
  - wherein said input electrode comprises an interdigital transducer having a plurality of taps aligned in a propagation direction of the surface acoustic wave, each of said taps comprises at least one pair of electrode fingers, and, of any two adjacent taps, a crossing width of said electrode fingers of a tap nearer said output electrode is smaller than a crossing width of said electrode fingers of a tap farther from said output electrode.

26. A device according to claim 25, wherein said output electrode comprises an interdigital transducer.

27. A device according to claim 25, wherein the input signal is a spread spectrum signal.

28. A demodulation device comprising:

a surface acoustic wave device for outputting a correlation signal on the basis of an input signal modulated according to data;

a detection circuit for delay-detecting the correlation signal output from said surface acoustic wave device; and a data judging circuit for judging data on the basis of the output from said detection circuit, said surface acoustic wave device comprising:

a piezoelectric substrate;

an input electrode, formed on said substrate, for generating a surface acoustic wave which propagates in a predetermined direction in accordance with an input signal; and an output electrode, formed on said substrate, for converting the surface acoustic wave into the correlation signal, wherein said output electrode comprises an interdigital transducer having a plurality of taps aligned in a propagation direction of the surface acoustic wave, each of said taps comprises at least one pair of electrode fingers, and, of any two adjacent taps, a crossing width of said electrode fingers of a tap nearer said input electrode is smaller than a crossing width of said electrode fingers of a tap farther from said input electrode.

29. A device according to claim 28, wherein said input electrode comprises an interdigital transducer.

30. A device according to claim 28, wherein the input signal is a spread spectrum signal.

31. A communication system comprising:

a transmitter for transmitting a signal modulated according to data;

a receiver circuit for receiving the signal transmitted from said transmitter;

a surface acoustic wave device for outputting a correlation signal on the basis of the signal received by said receiver circuit;

a detection circuit for delay-detecting the correlation signal output from said surface acoustic wave device; and a data judging circuit for judging data on the basis of the output from said detection circuit, said surface acoustic wave device comprising:

a piezoelectric substrate;

an input electrode, formed on said substrate, for generating a surface acoustic wave which propagates in a predetermined direction in accordance with an input signal; and an output electrode, formed on said substrate, for converting the surface acoustic wave into the correlation signal, wherein said input electrode comprises a plurality of taps aligned in a propagation direction of the surface acoustic wave, and said taps are weighted, so that surface acoustic waves generated from said taps have substantially equal magnitudes when they reach said output electrode.

32. A system according to claim 31, wherein said input electrode comprises an interdigital transducer, and each of said taps of said input electrode comprises at least one pair of electrode fingers.

33. A system according to claim 31, wherein said output electrode comprises an interdigital transducer.

34. A system according to claim 31, wherein the signal transmitted from said transmitter is a spread spectrum signal.

35. A communication system comprising:

a transmitter for transmitting a signal modulated according to data;

a receiver circuit for receiving the signal transmitted from said transmitter;

a surface acoustic wave device for outputting a correlation signal on the basis of the signal received by said receiver circuit;

a detection circuit for delay-detecting the correlation signal output from said surface acoustic wave device; and a data judging circuit for judging data on the basis of the output from said detection circuit, said surface acoustic wave device comprising:

a piezoelectric substrate;

an input electrode, formed on said substrate, for generating a surface acoustic wave which propagates in a predetermined direction in accordance with an input signal; and an output electrode, formed on said substrate, for converting the surface acoustic wave into the correlation signal, wherein said output electrode comprises a plurality of taps aligned in a propagation direction of the surface acoustic wave, and said taps are weighted, so that signals output from said taps have substantially equal magnitudes.

36. A system according to claim 35, wherein said output electrode comprises an interdigital transducer, and each of said taps of said output electrode comprises at least one pair of electrode fingers.

37. A system according to claim 35, wherein said input electrode comprises an interdigital transducer.

38. A system according to claim 35, wherein the signal transmitted from said transmitter is a spread spectrum signal.

39. A communication system comprising:

a transmitter for transmitting a signal modulated according to data;

a receiver circuit for receiving the signal transmitted from said transmitter;

a surface acoustic wave device for outputting a correlation signal on the basis of the signal received by said receiver circuit;

a detection circuit for delay-detecting the correlation signal output from said surface acoustic wave device; and a data judging circuit for judging data on the basis of the output from said detection circuit, said surface acoustic wave device comprising:

a piezoelectric substrate;

an input electrode, formed on said substrate, for generating a surface acoustic wave which propagates in a predetermined direction in accordance with an input signal; and an output electrode, formed on said substrate, for converting the surface acoustic wave into the correlation signal, wherein said input electrode comprises an interdigital transducer having a plurality of taps aligned in a propagation direction of the surface acoustic wave, each of said taps comprises at least one pair of electrode fingers, and, of any two adjacent taps, a crossing width of said electrode fingers of a tap nearer said output electrode is smaller than a crossing width of said electrode fingers of a tap farther from said output electrode.

40. A system according to claim 39, wherein said output electrode comprises an interdigital transducer.

41. A system according to claim 39, wherein the signal transmitted from said transmitter is a spread spectrum signal.

42. A communication system comprising:
a transmitter for transmitting a signal modulated according to data;
a receiver circuit for receiving the signal transmitted from said transmitter;
a surface acoustic wave device for outputting a correlation signal on the basis of the signal received by said receiver circuit;
a detection circuit for envelope-detecting the correlation signal output from said surface acoustic wave device; and
a data judging circuit for judging data on the basis of the output from said detection circuit,
said surface acoustic wave device comprising:
a piezoelectric substrate;
an input electrode, formed on said substrate, for generating a surface acoustic wave which propagates in a predetermined direction in accordance with an input signal; and
an output electrode, formed on said substrate, for converting the surface acoustic wave into the correlation signal,
wherein said output electrode comprises an interdigital transducer having a plurality of taps aligned in a propagation direction of the surface acoustic wave, each of said taps comprises at least one pair of electrode fingers, and, of any two adjacent taps, a crossing width of said electrode fingers of a tap nearer said input electrode is smaller than a crossing width of said electrode fingers of a tap farther from said input electrode.

43. A system according to claim 42, wherein said input electrode comprises an interdigital transducer.

44. A system according to claim 42, wherein the signal transmitted from said transmitter is a spread spectrum signal.

45. A device according to claim 1, wherein each polarity of said plurality of taps of said input electrode is at least one of a first polarity and a second polarity which are opposite polarities to each other.

46. A device according to claim 10, wherein each polarity of said plurality of taps of said input electrode is at least one of a first polarity and a second polarity which are opposite polarities to each other.

47. A device according to claim 4, wherein each polarity of said plurality of taps of said output electrode is at least one of a first polarity and a second polarity which are opposite polarities to each other.

48. A device according to claim 12, wherein each polarity of said plurality of taps of said output electrode is at least one of a first polarity and a second polarity which are opposite polarities to each other.

* * * * *

UNITED STATES PATENT AND TRADEMARK OFFICE
CERTIFICATE OF CORRECTION

PATENT NO. : 5,374,863
DATED : December 20, 1994
INVENTOR(S) : Mochizuki et al.

It is certified that error appears in the above-indentified patent and that said Letters Patent is hereby corrected as shown below:

COLUMN 7:

Line 2, "same" should read --the same--.

Signed and Sealed this

Twenty-third Day of May, 1995

*Attest:*

BRUCE LEHMAN

*Attesting Officer*    *Commissioner of Patents and Trademarks*